United States Patent
Fischer et al.

(10) Patent No.: US 6,603,699 B2
(45) Date of Patent: Aug. 5, 2003

(54) CONFIGURATION FOR FUSE INITIALIZATION

(75) Inventors: Helmut Fischer, Taufkirchen (DE); Thilo Schaffroth, Röhrmoos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/978,398

(22) Filed: Oct. 16, 2001

(65) Prior Publication Data

US 2002/0044492 A1 Apr. 18, 2002

(30) Foreign Application Priority Data

Oct. 16, 2000 (DE) .......................... 100 51 167

(51) Int. Cl.⁷ .............. G11C 7/00; G11C 8/00
(52) U.S. Cl. .............. 365/225.7; 365/189.05; 365/230.08
(58) Field of Search ............ 365/225.7, 189.05, 365/230.08, 241, 200, 191

(56) References Cited

U.S. PATENT DOCUMENTS

| | | | | |
|---|---|---|---|---|
| 5,970,000 A | | 10/1999 | Kirihata et al. | 365/200 |
| 6,118,306 A | * | 9/2000 | Orton et al. | 327/44 |
| 6,163,490 A | * | 12/2000 | Shaffer et al. | 365/200 |
| 6,191,982 B1 | * | 2/2001 | Morgan | 365/200 |

FOREIGN PATENT DOCUMENTS

DE    198 23 687 A 1    12/1999

* cited by examiner

*Primary Examiner*—Thong Le
(74) *Attorney, Agent, or Firm*—Laurence A. Greenberg; Werner H. Stemer; Ralph E. Locher

(57) ABSTRACT

The invention relates to a configuration for fuse initialization, in which the fuse initialization signals bFPUP, FPUN are carried on a total of two lines to the individual fuse banks, and are sent back with a time delay.

8 Claims, 4 Drawing Sheets

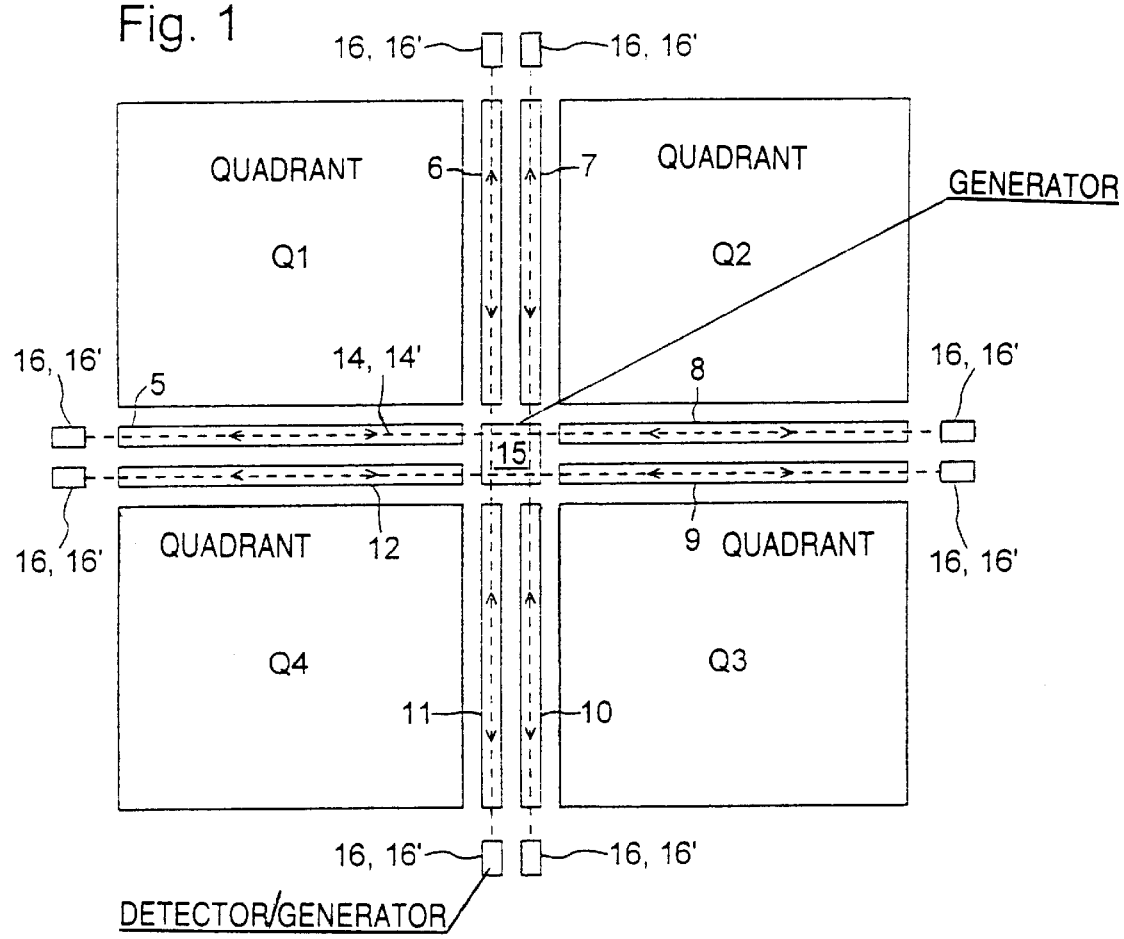

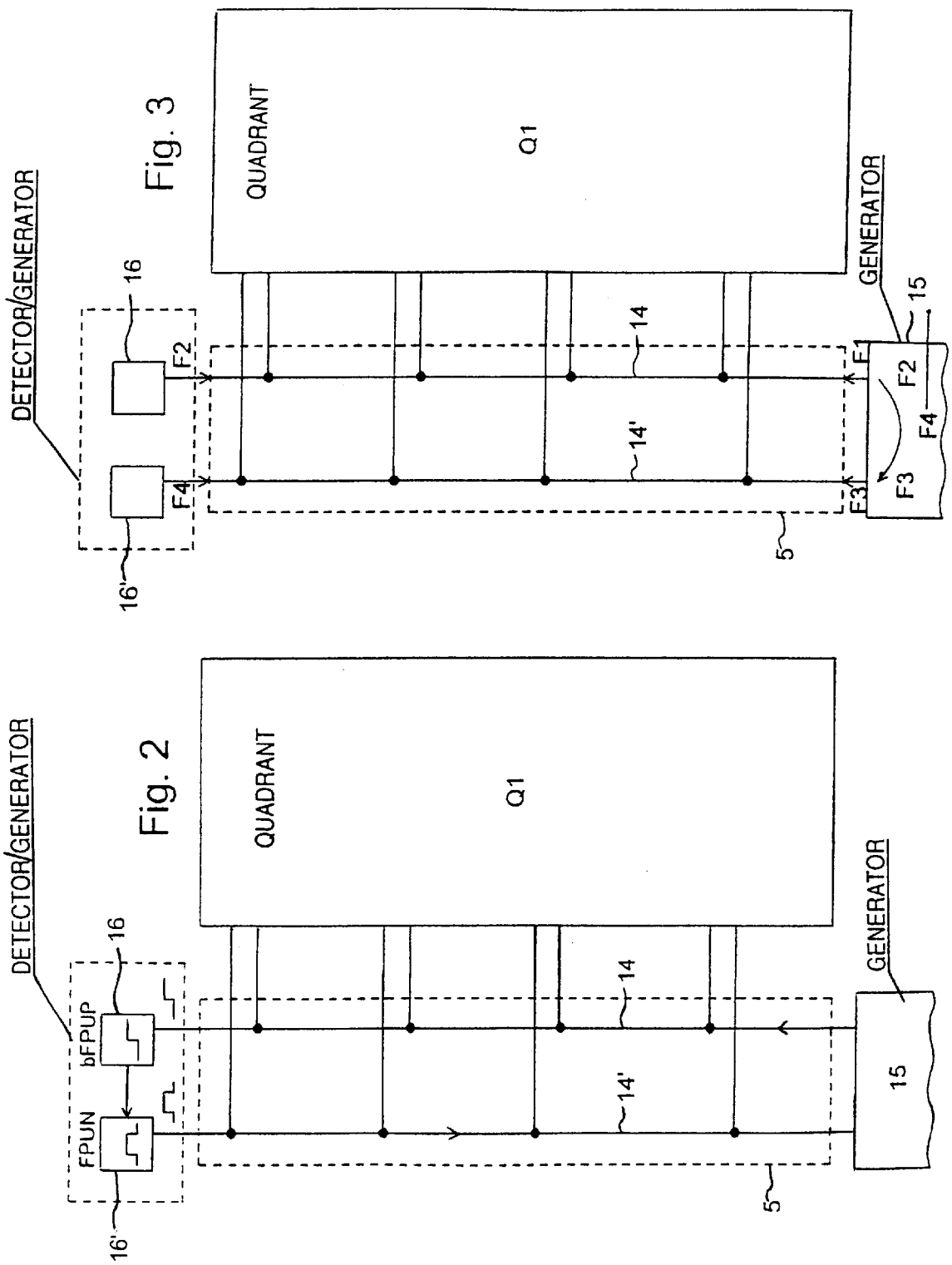

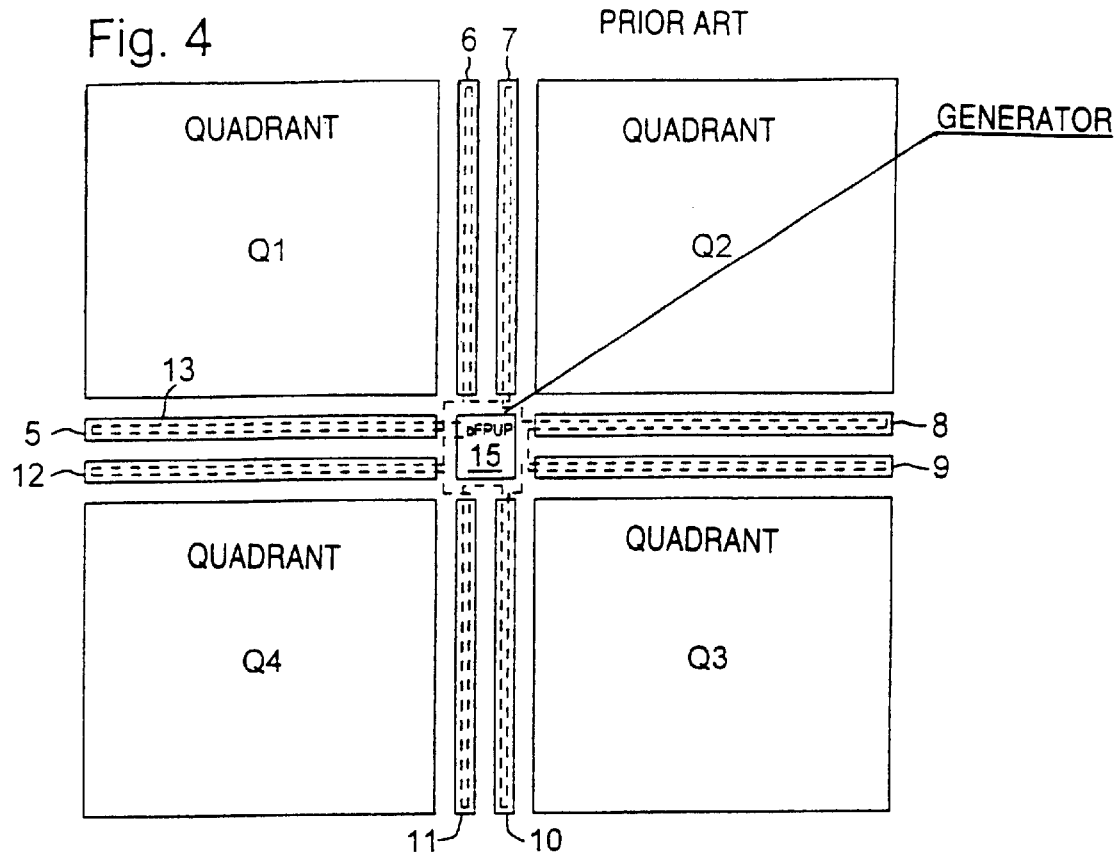
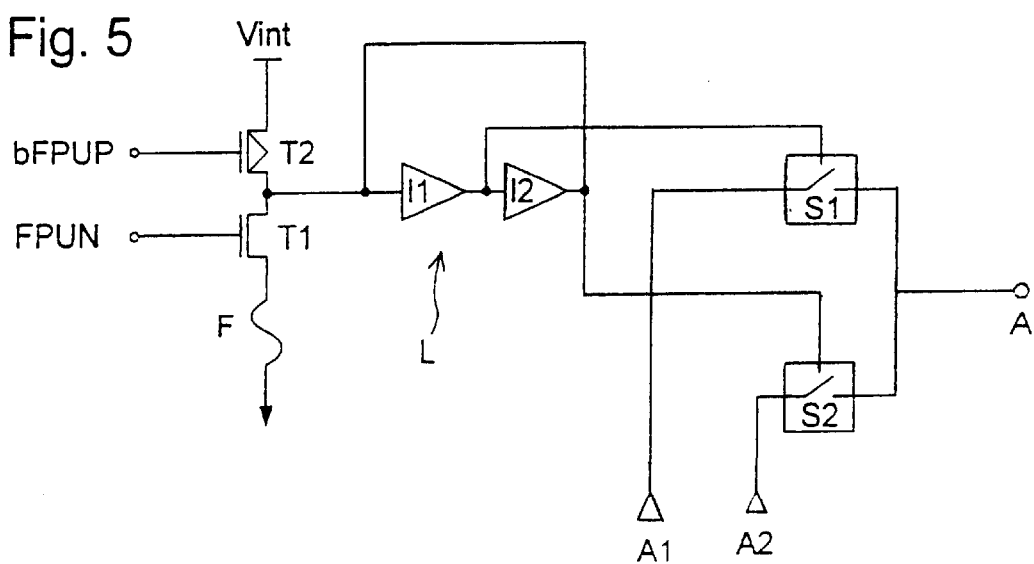

CONFIGURATION FOR FUSE INITIALIZATION

BACKGROUND OF THE INVENTION

Field of the Invention

The present invention relates to a configuration for fuse initialization having at least one fuse bank which has a number of fuses in which redundant information is stored. The fuse bank can be read by a first and a second initialization signal, which are produced by a generator device. In each case one latch is associated with each fuse. The term "fuses" is in this case also intended to mean antifuses. The invention is preferably used in a memory whose memory cell array is subdivided into quadrants along which the fuse banks extend.

Redundant information that is stored in fuses is read to latches (locking elements) upon activation or start-up of a memory, for example a DRAM (Dynamic Random Access Memory). These latches buffer-store the redundant information and are located immediately adjacent to the fuses. In this case, each fuse has an associated latch.

Two initialization signals are required to read in redundant information, namely a first initialization signal bFPUP (bar fuse power up), which is an enabled signal, and a second initialization signal, FPUN, which is a control signal for latching in the redundant information and consists of a pulse which allows the redundant information to be buffer-stored in the latches for its duration.

FIG. 4 schematically shows a memory having a memory cell array including four quadrants Q1 to Q4, and fuse banks 5 to 12 that are located between these quadrants Q1 to Q4. The fuse banks 5 and 6 are associated with the quadrant Q1, while the fuse banks 7 and 8 are associated with the quadrant Q2, the fuse banks 9 and 10 are associated with the quadrant Q3, and the fuse banks 11 and 12 are associated with the quadrant Q4. In this case, the fuse banks 5 and 6 are located along two sides of the quadrant Q1, which are opposite the adjacent quadrants Q4 and Q2 and spaced away by a gap. A corresponding situation applies to the fuse banks 7 and 8 with respect to the quadrant Q2, to the fuse banks 9 and 10 with respect to the quadrant Q3, and to the fuse banks 11 and 12 with respect to the quadrant Q4. The fuses in the fuse banks 5 to 12 are in this case each associated with individual segments or arrays of the quadrants Q1 to Q4.

FIG. 5 shows a fuse F with an associated latch L. The fuse F is connected in series with a series circuit, which includes an n-channel MOS transistor T1 and a p-channel MOS transistor T2. The combination of the series circuit and the fuse F is connected between a fixed potential (frame or ground) and a supply voltage Vint. The first initialization signal bFPUP is applied to the gate of the transistor (T2), while the second initialization signal (FPUN) is applied to the gate of the transistor T1.

The node between the two transistors T1 and T2 is connected to the input of a first inverter I1 and to the output of a second inverter I2 that is downstream from the first inverter I1. In addition, the output of the first inverter I1 is connected to the control input of a first controlled switch S1, while the output of the second inverter I2 is connected to the control input of a second controlled switch S2.

A first signal A1 is applied to the input of the first switch S1, while a second signal A2 is applied to the input of the second switch S2.

FIG. 6 shows the profile of the supply voltage Vint, the profile of the first initialization signal bFPUP, and the profile of the second initialization signal FPUN as a function of time T.

When the supply voltage Vint is switched on, that is to say is high, the transistor T2 is switched on, while the transistor T1 is still switched off, since both signals bFPUP and FPUN are low. The supply voltage Vint is thus applied to the input of the latch L, so that its pre-initialization takes place. If the first initialization signal bFPUP then changes to high (flank F2), the transistor T2 then is switched off. The latch L is thus disconnected from the supply voltage Vint. Once the second initialization signal, or pulse, FPUN has been switched on (flank F3), the transistor T1 is switched on, while the transistor T2 is switched off and the fuse information from the fuse F is thus supplied to the latch L. Depending on the content of this information ("1") or ("0"), the switch S1 is switched on, while the switch S2 is switched off, or the switch S1 is switched off while the switch S2 is switched on. This writing process for the fuse information is terminated with the end of the pulse FPUN (flank F4). The signal A1 or the signal A2 is thus produced at an output A of the switches S1 and S2, depending on the fuse information for the fuse F.

FIG. 7 shows one possible signal profile, which occurs when the first initialization signal bFPUP starts up together with the supply Vint. In this case, the pre-initialization of the latch L takes place on the trailing edge (flank F1) of the signal (bFPUP).

The two initialization signals bFPUP and FPUN must be supplied to all of the fuses in the fuse banks 5 to 12 upon activation of the memory, so that these fuses can read their respective information to the associated latches. Each individual fuse F has an associated latch L of the type shown in FIG. 5. Other circuit configurations may, of course, also be chosen for the latches L in this case.

In order to allow the initialization with the two initialization signals bFPUP and FPUN, lines 13 are routed in the form of loops along the fuse banks 5 to 12. FIG. 4. shows one of the lines 13, in the form of dashed lines, for the first initialization signal bFPUP. A corresponding line loop is required for the second initialization signal FPUN.

The first initialization signal bFPUP thus first of all runs on the line 13 along the fuse bank 5 from the center of the memory to its edge, and then along this fuse bank 5 back again, in order then to be routed successively in a corresponding manner through the fuse banks 6 to 12.

Since the same situation also applies to the second initialization signal FPUN and to its line, this means that a total of four lines are in each case required along the fuse banks 5 to 12 and along mutually adjacent sides of the quadrants Q1 to Q4.

Thus, in a corresponding way to the scheme shown in FIG. 4, the fuse initialization process runs sequentially over the entire chip of the memory, which results in a uniform current distributed over time, which is advantageous for starting up, during the initialization phase.

Depending on the chip architecture of a memory, the area consumed by individual areas on the chip may be dominated by transistors or by lines. In the latter case, a saving of lines reduces the area, which is a considerable advantage. This is particularly true when additional transistors are required due to the saving of lines.

SUMMARY OF THE INVENTION

It is accordingly an object of the invention to provide a configuration for fuse initialization which overcomes the above-mentioned disadvantageous of the prior art apparatus of this general type. In particular, it is an object of the invention to provide a configuration for fuse initialization, in which it is possible to reduce the area that is required on a chip.

With the foregoing and other objects in view there is provided, in accordance with the invention, a configuration for fuse initialization, that includes: a plurality of latches; a plurality of fuse banks, each one of the plurality of the fuse banks having a plurality of fuses storing redundant information, each one of the plurality of the fuses associated with a respective one of the plurality of the latches; a generator device for generating a plurality of initialization signals which are used for reading the plurality of the fuses, the plurality of initialization signals including a first initialization signal and a second initialization signal; a plurality of first lines and a plurality of second lines; and a memory cell array having four quadrants, each one of the quadrants having edges that are adjacent to others of the quadrants. Each one of the plurality of the fuse banks is located along a respective one of the edges of one of the quadrants. Each one of the plurality of the fuse banks serially receives the first initialization signal from a respective one of the first lines and the second initialization signal from a respective one of the second lines. The respective one of the first lines and the respective one of the second lines are different lines. The respective one of the first lines and the respective one of the second lines each have a beginning and an end at which ones of the plurality of the initialization signals are delayed.

In the configuration for fuse initialization of the type mentioned initially, the object of the invention is achieved because the first initialization signal is carried along a first line to the fuses, and the second initialization signal is fed back on a second line with a delay.

Of the four lines mentioned in the background, which are each associated with one fuse bank, is thus possible to save a total of two lines which, with respect to these lines, means a surface area reduction of about 50%. To this end, circuits which detect a change in the first initialization signal and then, in each case, pass back the other initialization signal on the other line with a delay are integrated at the end of the quadrant of the memory cell array, or of corresponding chip areas. In addition to the generator device for the two initialization signals, a circuit which detects the signals sent back and feeds them with a time delay into the area of the next fuse bank is integrated in the center region of the memory, or in the chip center.

In accordance with an added feature of the invention, it is also possible to control the generator device for the initialization signals such that it feeds the two initialization signals into the areas of the individual fuse bank, with a time delay.

The invention makes it possible to save two lines, on the inside of a quadrant of the memory cell array, that is to say a total of 2×2×4=16 lines over the entire chip for the memory, by providing appropriate receiving and transmitting circuits, which detect the initialization signals and pass them on with a time delay, at each of the ends of the areas of the individual fuse banks.

Other features which are considered as characteristic for the invention are set forth in the appended claims.

Although the invention is illustrated and described herein as embodied in a configuration for fuse initialization, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a schematic illustration of an exemplary embodiment of a memory having a memory cell array and fuse banks;

FIGS. 2 and 3 show two different versions of the exemplary embodiment shown in FIG. 1;

FIG. 4 shows a schematic illustration of a prior art configuration;

FIG. 5 shows a circuit diagram of a fuse F with a latch L; and

DESCRIPTION OF THE PREFERRED EMBODIMENTS

Figure 6:
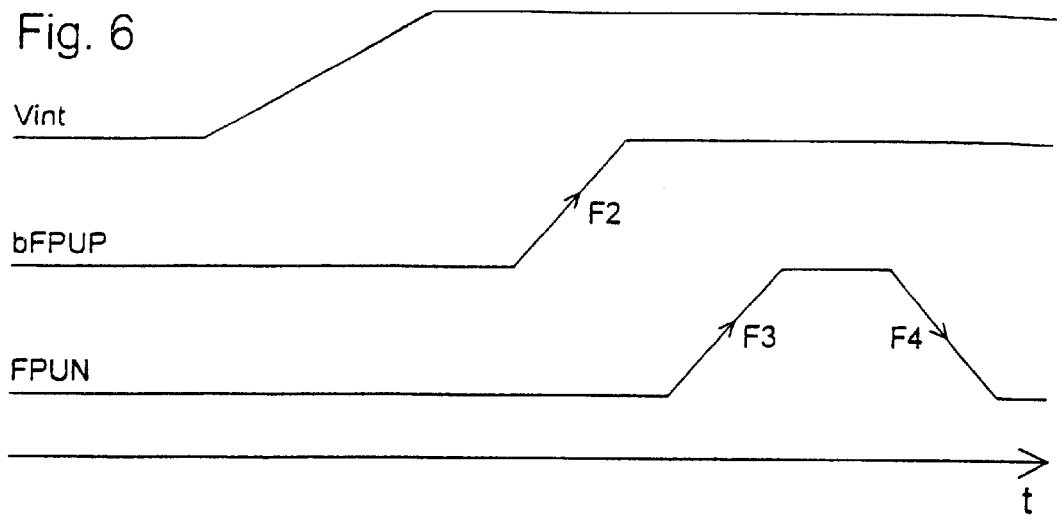
FIGS. 6 and 7 show two different versions of the profile of the supply voltage and the initialization signals as a function of time.

FIGS. 1 to 3 use the same reference symbols as those that have been used in FIGS. 4 to 7 for corresponding components. Referring now to the figures of the drawing in detail and first, particularly, to FIG. 1 thereof, there is shown a line 14 for the initialization signal bFPUP, which is emitted in the same way as the initialization signal FPUN from a generator device 15 that is in the center of the memory. In this case, only one respective line (14 or 14') is routed along each fuse bank 5 to 12 for the first initialization signal bFPUP and another respective line (14' or 14) is routed along each fuse bank 5 to 12 for the second initialization signal FPUN. Two versions of the quadrant Q1 and the associated fuse bank 5 are shown in FIGS. 2 and 3. A detector device and/or generator device 16 and a detector device and/or generator device 16' is respectively provided at the end of the respective lines 14 and 14' and detects a change in the respective initialization signal bFPUP or FPUN, and then either sends the other initialization signal FPUN on the other line 14' (see FIG. 2) back to the generator device 15, or sends this initialization signal back on the same line 14 or 14', respectively, with a delay (see FIG. 3). The generator device 15 also contains a circuit which detects the initialization signal that has been sent back, and feeds it, with a time delay, into the area of the respective next fuse bank.

The above operation will be described in more detail with reference to FIGS. 1 and 2, or FIGS. 1 and 3, respectively.

In the example shown in FIGS. 1 and 2, the initialization signal bFPUP is first of all, by way of example, carried on the line 14, which is associated with the fuse bank 5, to the detector device and/or generator device 16 that is provided at the end of this line 14. The flank F2 (see FIG. 6) of the initialization signal bFPUP is detected by the detector device 16. This detection of the flank F2 by the detector device 16 is then signaled to the detector and/or generator device 16', which feeds the pulse, FPUN into the line 14'. The circuit in the generator device 15 detects the initialization signal FPUN, or its flank F4, which has been fed back, and then inputs the first initialization signal bFPUP, with a time delay, into the line 14 for the next fuse bank 6, for which it is then dealt with in the same way as for the fuse bank 5. The same process is then repeated in a corresponding manner for the lines 14, 14' of the fuse banks 7 to 12.

Figure 7:
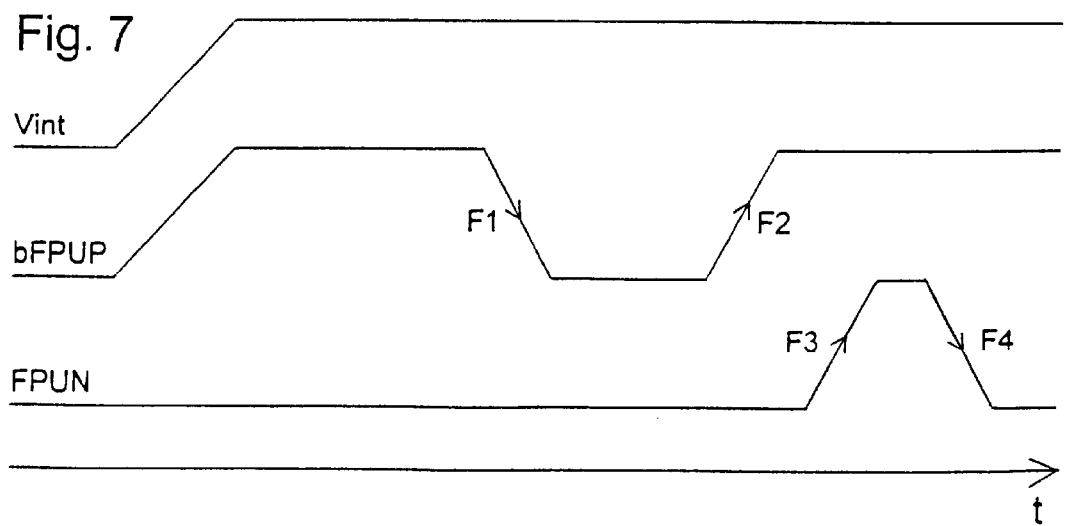

In the version shown in FIGS. 1 and 3, it is assumed that the first initialization signal bFPUP starts up together with the supply voltage Vint, as is shown in FIG. 7. As soon as the arrival of the flank Fl of the signal bFPUP is detected by the generator device 15 of the detector and/or the generator device 16 at the end of the line 14, the detector and/or generator device 16 sends the flank F2 of the signal bFPUP back to the generator device 15 on the same line 14. When the flank F2 of the signal bFPUP arrives in the generator device 15, the latter sends the flank F3 of the second initialization signal FPUN on the line 14' to the detector and/or generator device 16'. Once the flank F3 of the signal FPUN has arrived at the detector and/or generator device 16', the flank F4 of the signal FPUN is sent back on the line 14' to the generator device 15.

Once the flank F4 of the signal FPUN has arrived in the generator device 15, the same operation, which was explained above for the fuse bank 5, is initiated for the next fuse bank 6, and so on.

In one development of the invention, it is also possible to configure the two initialization signals bFPUP and FPUN such that they do not pass through the individual lines 14, which are associated with the respective fuse banks 5 to 12, and 5 pass through the detector devices 16, 16' as well as the circuit in the generator device 15 sequentially, but rather, for the respective first or second initialization signal, which is produced by the generator device 15, to be fed with a time delay into the lines 14 and 14' of the individual fuse banks 5 to 12. There is, thus, no need for the detector and/or generator devices 16, 16' in this case. The first initialization signal is passed by the generator device 15 to the line 14. Shortly after this, the second initialization signal is then fed into the line 14'. This operation is carried out in series for all the lines 14, 14' for the quadrants Q1 to Q4.

We claim:

1. A configuration for fuse initialization, comprising:
   a plurality of latches;
   a plurality of fuse banks, each one of said plurality of said fuse banks having a plurality of fuses storing redundant information, each one of said plurality of said fuses associated with a respective one of said plurality of said latches;
   a generator device for generating a plurality of initialization signals which are used for reading said plurality of said fuses, said plurality of initialization signals including a first initialization signal and a second initialization signal;
   a plurality of first lines and a plurality of second lines; and
   a memory cell array having four quadrants, each one of said quadrants having edges that are adjacent to others of said quadrants;
   each one of said plurality of said fuse banks located along a respective one of said edges of one of said quadrants;
   each one of said plurality of said fuse banks serially receiving the first initialization signal from a respective one of said first lines and the second initialization signal from a respective one of said second lines;
   said respective one of said first lines and said respective one of said second lines being different lines; and
   said respective one of said first lines and said respective one of said second lines each having a beginning and an end at which ones of the plurality of the initialization signals are delayed.

2. The configuration according to claim 1, wherein the second initialization signal is sent back on said respective one of said second lines.

3. The configuration according to claim 2, comprising:
   a first detector device located at said end of said respective one of said first lines and receiving the first initialization signal; and
   a second detector and generator device located at said end of said respective one of said second lines;
   once the first initialization signal has arrived at the first detector device, said second detector and generator device sending the second initialization signal on said respective one of said second lines to said generator device.

4. The configuration according to claim 1, comprising:
   a detector device for detecting a change in a signal selected from the group consisting of the first initialization signal and the second initialization signal;
   said end of said respective one of said first lines and said end of said respective one of said second lines defining ends that are located remote from said generator device; and
   said detector device located adjacent said ends and sending back the detected signal with a delay.

5. The configuration according to claim 4, wherein said detector device detects a first flank in the first initialization signal which is received from said respective one of said first lines; and
   said detector device sends back a second flank of the first initialization signal on said respective one of said first lines.

6. The configuration according to claim 4, wherein said detector device detects a first flank in the second initialization signal which is received from said respective one of said second lines; and
   said detector device sends back a second flank of the second initialization signal on said respective one of said second lines.

7. The configuration according to claim 1, wherein said generator device generates the plurality of the initialization signals with a time delay.

8. The configuration according to claim 7, wherein said generator device feeds the plurality of the initialization signals, with a time delay, into each one of said plurality of said fuse banks via said respective one of said first lines and said respective one of said second lines.

* * * * *